(12) United States Patent
Dittus et al.

(10) Patent No.: US 8,978,245 B2
(45) Date of Patent: Mar. 17, 2015

(54) METHOD OF SECURING ELECTRONIC DEVICES WITHIN A SUB-CHASSIS

(71) Applicant: International Business Machines Corporation, Armonk, NY (US)

(72) Inventors: Karl K. Dittus, Durham, NC (US); David J. Jensen, Raleigh, NC (US); Brian A. Trumbo, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 207 days.

(21) Appl. No.: 13/731,036

(22) Filed: Dec. 30, 2012

(65) Prior Publication Data
US 2014/0182108 A1   Jul. 3, 2014

Related U.S. Application Data

(63) Continuation of application No. 13/729,349, filed on Dec. 28, 2010, now Pat. No. 8,724,330.

(51) Int. Cl.
*H05K 3/30* (2006.01)
*H05K 13/04* (2006.01)
*H05K 7/14* (2006.01)

(52) U.S. Cl.
CPC ........... *H05K 13/04* (2013.01); *Y10T 29/49826* (2015.01); *H05K 7/1489* (2013.01)
USPC ................ 29/832; 29/840; 361/792; 361/796

(58) Field of Classification Search
CPC .............................. H05K 13/04; H05K 7/1489
USPC ....................... 29/830, 832, 840; 361/792, 796
See application file for complete search history.

(56) References Cited

U.S. PATENT DOCUMENTS

| | | | |
|---|---|---|---|
| 6,058,579 A | 5/2000 | Brocklesby et al. | |
| 6,256,205 B1 | 7/2001 | Perry et al. | |
| 6,494,729 B1 | 12/2002 | Stathopoulos et al. | |
| 6,646,883 B2 | 11/2003 | Salinas | |
| 6,748,458 B2 | 6/2004 | Andrewartha et al. | |
| 7,046,520 B2 * | 5/2006 | Sundstrom | 361/769 |
| 7,283,374 B2 | 10/2007 | Pedoeem et al. | |
| 7,382,626 B2 | 6/2008 | Dingfelder et al. | |

* cited by examiner

*Primary Examiner* — Carl Arbes
(74) *Attorney, Agent, or Firm* — Katherine S. Brown; Jeffrey L. Streets

(57) ABSTRACT

A method includes securing a midplane to a bracket disposed between a first and second ends of a chassis, wherein a first surface of the midplane engages the bracket and faces the first end of the chassis. A first electronic device is secured within the first end of the chassis with a first device connector coupled to a first midplane connector on the first surface of the midplane and a first device latch secured directly to a first slot in the chassis adjacent the first end. A sub-chassis is secured within the second end of the chassis, wherein the sub-chassis has a proximal end that engages a second surface of the midplane. Furthermore, a second electronic device is secured within the sub-chassis with a second device connector coupled to a second midplane connector on the second surface of the midplane and a second device latch secured directly to a slot in the sub-chassis adjacent the distal end of the sub-chassis.

10 Claims, 8 Drawing Sheets

METHOD OF SECURING ELECTRONIC DEVICES WITHIN A SUB-CHASSIS

CROSS-REFERENCE TO RELATED APPLICATIONS

This application is a continuation of co-pending U.S. patent application Ser. No. 13/729,349, filed on Dec. 28, 2012.

BACKGROUND OF THE INVENTION

1. Field of the Invention

The present invention relates to an apparatus to position and secure a sub-chassis within a chassis.

2. Background of the Related Art

An electronic device within a computer system may be connected to other electronic components through connectors that enable the communication of data signals therebetween. For example, a first electronic device, having a connector thereon, may send signals through the connector and to a second electronic device also having a connector that is engaged by the connector on the first electronic component. Connectors come in a variety of configurations including, but not limited to, pin and socket connectors, pin and sleeve connectors, parallel port, USB and serial connectors, to name a few. The connectors of the first electronic component and the second electronic component may be directly engaged or indirectly engaged through an intermediate structure, such as a midplane installed in a chassis.

A midplane is generally an electronic interface board installed within a chassis to support one or more connectors on a front side and one or more connectors on a back side. An electronic device having a connector may be coupled to a connector on the front side of the midplane in order to enable communication with one or more other electronic device having a connector coupled to a different connector on either the front or back side of the midplane.

For example, the connector of a first electronic device having a circuit board may include a row of elongated conductive pads aligned along an edge of the circuit board to be received into a socket connector on the front side of a midplane to engage the row of pads with a corresponding row of signal pins within the socket. A second electronic component, such as a network switch having a pin and sleeve connector, can be connected to a connector on the back side of the midplane to enable electronic communication between the network switch and the first electronic device through circuitry within the midplane. A midplane provides for convenient installation, maintenance and substitution of electronic devices in a chassis without having to remove or manipulate other electronic devices and without having to handle and manage a large number of cables.

As the frequency of electronic signals continues to increase, and as the voltages associated with these signals decreases, electronic noise becomes more of a concern. High-speed and low-voltage signals are more susceptible to electronic noise disruption than are low-speed and high-voltage signals. One source of electronic noise relates to conductive stubs. A stub is a portion of a conductor that extends beyond the true point of contact between two conductive members. In a connector, a stub can result from the need to accommodate electronic component connector tolerances. For example, as an edge of the circuit board is received into a corresponding socket to engage a row of pads along the edge of the circuit board with a corresponding row of signal pins within the socket, each pad initially engages the corresponding signal pin and then slides or "swipes" along the signal pin until the card is secured in an operable position. The resulting "true" point of contact between a pad and a corresponding signal pin may leave a stub comprising the portion of the conductive pad that extends past the point of true contact with the signal pin. The stub is not in a direct conductive pathway between the true point of contact and the electronic device, and is not a useful part of the circuit. However, a stub of this type can be the source of unwanted electronic signal reflections in a high-speed, low-voltage electronic signal.

Connectors for electronic devices are generally manufactured to function notwithstanding minor variations in the physical dimensions of the connectors or the electronic components that are electronically coupled through the connectors. For example, a socket on a midplane and a card edge of a circuit board to be received into the socket are each manufactured within certain tolerances to ensure that the card edge of the circuit board will fit within the socket and to ensure that when the card edge is received within the socket, the pads along the card edge conductively engage the corresponding signal pins within the socket. To ensure conductive engagement, the pads along the card edge are generally elongate along the direction of the card edge insertion so that any variance in the dimensions of the circuit board, socket, or relevant chassis does not prevent conductive contact between the pads and the signal pins. As a result, a substantial portion of each pad along the card edge may engage and then move past the true point of contact with the corresponding signal pin to create a stub. The length of each of the elongate pads in the direction of insertion of the card edge may be referred to as the "swipe" of the pad because the action of the pad "swipes" along the signal pin as the card edge of the circuit board is inserted into the socket.

BRIEF SUMMARY OF THE INVENTION

Another embodiment of the present invention provides a method comprising: securing a midplane to a bracket disposed between a first and second ends of a chassis, wherein a first surface of the midplane engages the bracket and faces the first end of the chassis; securing a first electronic device within the first end of the chassis with a first device connector coupled to a first midplane connector on the first surface of the midplane and a first device latch secured directly to a first slot in the chassis adjacent the first end; securing a sub-chassis within the second end of the chassis, wherein the sub-chassis has a proximal end that engages a second surface of the midplane; and securing a second electronic device within the sub-chassis with a second device connector coupled to a second midplane connector on the second surface of the midplane and a second device latch secured directly to a slot in the sub-chassis adjacent the distal end of the sub-chassis.

DETAILED DESCRIPTION OF THE INVENTION

Figure 1:
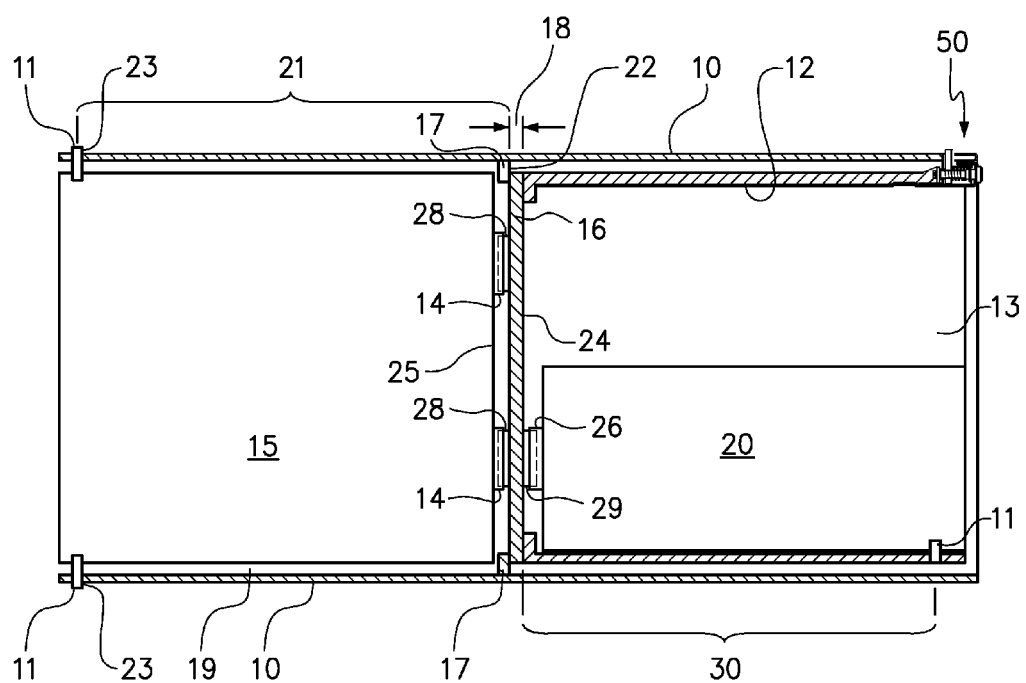
FIG. 1 is a sectional side view of a chassis having a midplane received therein to separate a first bay from a second bay.

One embodiment of the present invention provides an apparatus comprising a chassis and a sub-chassis. The chassis has a first end, a second end, a bracket between the first and second ends, a first slot adjacent the first end, and a second slot adjacent the second end. The bracket is positioned for securing a first surface of a midplane at a known distance from the first slot, wherein a first electronic device is selectively securable within the first end of the chassis with a first device connector coupled to the first surface of the midplane and a first device latch secured to the first slot. The sub-chassis is receivable within the second end of the chassis, wherein the sub-chassis has a proximal end that engages a second surface of the midplane, a distal end having a sub-chassis latch that selectively engages the second slot to secure the sub-chassis in the second end of the chassis with the proximal end engaged against the second surface, and a sub-chassis slot adjacent the distal end of the sub-chassis that is a known distance from the proximal end of the sub-chassis. A second electronic device is selectively securable within the distal end of the sub-chassis with a second device connector coupled to the second surface of the midplane and a second device latch secured to the sub-chassis slot.

In another embodiment, the sub-chassis latch comprises a shaft that is rotatably coupled to the sub-chassis and has a threaded portion. A pawl is threadably coupled to the threaded portion of the shaft and pivotable from a passive position to an active position protruding beyond an edge of the sub-chassis to enter the second slot of the chassis. The pawl is movable in the active position along the threaded portion of the shaft by rotation of the shaft to urge the pawl against a load surface of the second slot which imparts a reactive force urging the proximal end of the sub-chassis into engagement with the second surface of the midplane.

In another embodiment of the apparatus of the present invention, the electronic component installable in the sub-chassis can be one of a network switch and a power supply module.

The sub-chassis may be movably coupled to the chassis using a slidable coupling between the sub-chassis and the chassis. For example, but not by way of limitation, the slidable coupling may comprise a bracket mounted on the chassis and a follower mounted on the sub-chassis to slidably engage the bracket on the chassis and to thereby enable sliding movement of the sub-chassis relative to the chassis and between a first position separated from the midplane and a second position proximal to the midplane. In a related embodiment, the bracket on the chassis may comprise a portion that protrudes from the chassis and the follower on the shuttle may comprise an elongate recess on the sub-chassis to slidably receive the portion protruding from the chassis.

In one embodiment of the apparatus of the present invention, the midplane is connected to a chassis bracket using one or more fasteners. For example, but not by way of limitation, the midplane may comprise a hole that aligns with a corresponding hole in the chassis bracket. A fastener, such as a bolt, screw or pin, is received through the hole in the chassis bracket and through the aligned hole in the midplane to secure the midplane in a desired position relative to the chassis.

In another embodiment of the apparatus of the present invention, the sub-chassis is adapted to receive a plurality of electronic components, each having a connector thereon, to be installed in the sub-chassis to electronically couple with a plurality of corresponding connectors on the midplane. In this embodiment, positioning the sub-chassis in the first position enables the pawl to be pivoted from the passive position to the active position adjacent to the load surface on the chassis, and subsequent movement of the sub-chassis relative to the chassis from the first position to the second position by rotation of the shaft moves the pawl against the load surface of the chassis to produce a reactive force on the sub-chassis urging the sub-chassis from the first position to the second position. Subsequent installation of the plurality of electronic components into the sub-chassis electronically couples the plurality of connectors on the plurality of electronic components installed in the sub-chassis with the corresponding plurality of connectors on the midplane.

Another embodiment of the present invention provides a method comprising: securing a midplane to a bracket disposed between a first and second ends of a chassis, wherein a first surface of the midplane engages the bracket and faces the first end of the chassis; securing a first electronic device within the first end of the chassis with a first device connector coupled to a first midplane connector on the first surface of the midplane and a first device latch secured directly to a first slot in the chassis adjacent the first end; securing a sub-chassis within the second end of the chassis, wherein the sub-chassis has a proximal end that engages a second surface of the midplane; and securing a second electronic device within the sub-chassis with a second device connector coupled to a second midplane connector on the second surface of the midplane and a second device latch secured directly to a slot in the sub-chassis adjacent the distal end of the sub-chassis.

In a further embodiment of the method, the sub-chassis may be secured within the second end of the chassis by engaging a second slot in the second end of the chassis with a latch carried on a distal end of the sub-chassis. The method may further include rotating a threaded shaft of the latch to draw a pawl in a distal direction against a load surface of the second slot. Drawing the pawl in the distal direction against the load surface of the second slot preferably imparts a reactive force urging the proximal end of the sub-chassis into engagement with the second surface of the midplane. In one specific implementation, the first electronic device is a blade server and the second electronic device is selected from a network switch, a power supply module, and a management module.

In yet another embodiment of the method, a threaded shaft of the latch is rotated to move a pawl from a passive position within the sub-chassis to an active position received within the second slot. Continued rotation of the threaded shaft of the latch draws the pawl, with the pawl in the active position, in a distal direction against a load surface of the second slot.

In a further embodiment, the method includes rotating a threaded shaft of the latch to move a pawl from a passive position within the sub-chassis to an active position received within the second slot. Then, continued rotation of the threaded shaft of the latch causes the pawl, with the pawl in the active position, to be drawn in a distal direction relative to the threaded shaft to engage a load surface of the second slot. Further continued rotation of the threaded shaft of the latch causes the pawl, with the pawl in the active position and engaged with the load surface, to be drawn in the distal direction until the proximal end of the sub-chassis is forced against the second surface of the midplane.

A further method includes guiding the sub-chassis within the second end of the chassis.

Embodiments of the method may also include the use of more than one latch. Optionally, the step of securing a sub-chassis within the second end of the chassis, includes engaging a first slot in the second end of the chassis with a first latch carried on a distal end of the sub-chassis and engaging a second slot in the second end of the chassis with a second latch carried on the distal end of the sub-chassis, wherein the first and second latches are on generally opposite sides of the sub-chassis.

Midplanes themselves may vary in thickness, and this creates an element of design uncertainty within a multi-component chassis in which a midplane is installed. A front side of a midplane can be disposed at a known datum within the chassis by securing the front side to a midplane bracket of the chassis at a known location. A conventional latch for securing an electronic component connected to the front side of the midplane can be disposed on the component for engaging a slot in the chassis at a location corresponding to a known dimension of the component (i.e., the distance from the midplane connector to the chassis slot is set to cooperate with the distance from an electronic component connector to the component latch. The datum of the opposite side of the midplane, however, is unknown due to potential variation in the thickness of the midplane. As a result, connectors must ordinarily have a large amount of swipe in order to assure a good connection while accommodating this potential variation. The present invention addresses this problem by providing a sub-chassis that engages flush against the second surface of the midplane to establish a new point of reference for the connection of electronic components.

FIG. 1 is a sectional side view of a chassis 10 having a midplane 16 received therein to separate a first bay 19 from a second bay 13. A midplane 16 is connected to a first side 22 of brackets 17 on the chassis 10 to dispose a first side 25 of the midplane 16 adjacent to the first bay 19 of the chassis 10 and a second side 24 of the midplane 16 adjacent to the second bay 13 of the chassis 10. A sub-chassis 12 is movably received within the second bay 13 of the chassis 10 and a server blade 15 is received and secured in the first bay 19 of the chassis 10.

The server blade 15 in the first bay 19 of the chassis 10 comprises electronic connectors 14 that engage corresponding electronic connectors 28 on the first side 25 of the midplane 16. The chassis 10 comprises two slots 23 positioned in the first bay 19 of the chassis 10 to connect to server latches 11 that secure the server blade 15 in the first bay 19. The server blade 15 is received in the first bay 19 and connected through connectors 14 to the midplane 16. The first side 25 of the midplane 16 is even with the first side 22 of the bracket 17 against which the midplane 16 is secured. The server blade 15 is of a known size, and the slots 23 that secure the server blade 15 in position within the first bay 19 of the chassis 10 are a known distance 21 from the first side 25 of the midplane 16. This arrangement provides for accurate positioning of the connectors 14 of the server blade 15 relative to the corresponding connectors 28 on the first side 25 of the midplane 16.

The thickness 18 of the midplane 16 may vary from one midplane to another. For example, when a midplane is upgraded, it may have a greater thickness to include additional functionality. Alternatively, the midplane manufacturing may cause variation in thickness between two units of the same midplane. The sub-chassis 12 and variable latch 50 of the present invention cooperate to ensure that an electronic component 20 can be positioned on board the sub-chassis 12 within the chassis 10, relative to the second side 24 of the midplane 16, for favorable electronic connection between a connector 26 on the electronic component 20 and a connector 29 on the second side 24 of the midplane 16. Specifically, since the sub-chassis 12 engages the second side 24 of the midplane 16, the slots 27 in the sub-chassis 12 that secure the electronic component 20 are a known distance 30 from the second side 24 of the midplane 16. Since the dimensions of the electronic component 20 are known, this arrangement provides for accurate positioning of the connectors 26 of the electronic component 20 relative to the corresponding connectors 29 on the second side 24 of the midplane 16. It should be recognized that this relationship is independent of the thickness of the midplane 16, since the sub-chassis 12 is always positioned relative to the second side 24 of the midplane 16.

Figure 2:
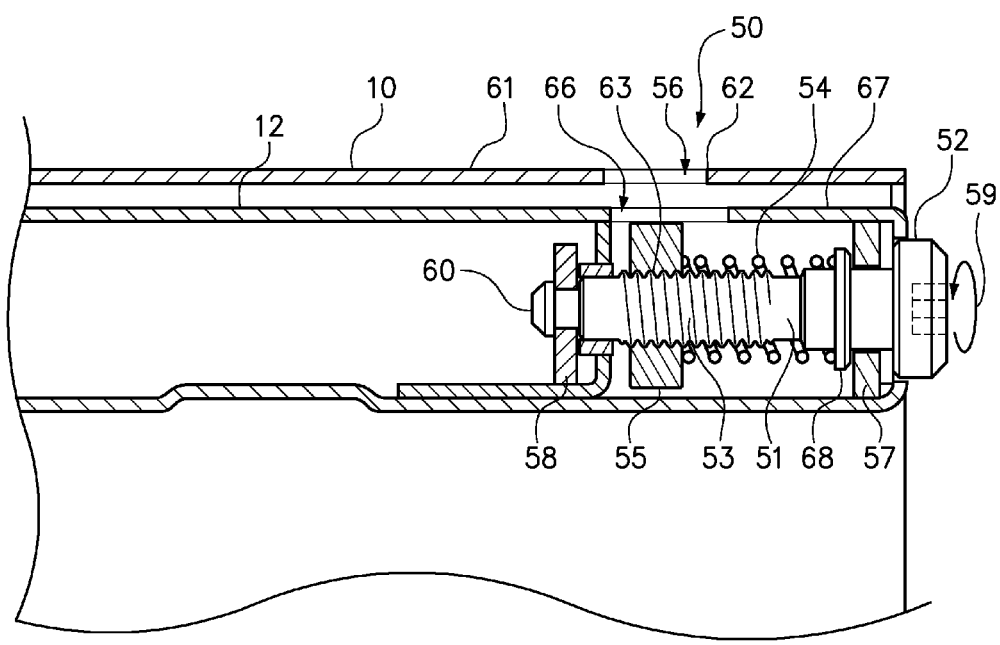
FIG. 2 is an enlarged sectional view of the variable latch of the sub-chassis of FIG. 1 with a pawl pivoted to a passive position adjacent to a slot in a wall of the sub-chassis that is aligned with slot in a wall of the chassis.

FIG. 2 is an enlarged sectional view of the variable latch 50 of the sub-chassis 12 of FIG. 1 with a pawl 55 pivoted to a passive position adjacent to a slot 66 in a wall 67 of the sub-chassis 12 that is aligned with slot 56 in a wall 61 of the chassis 10. The variable latch 50 comprises a shaft 51 having a head 52, an end 60 and a threaded portion 53 intermediate the head 52 and the end 60. The shaft 51 is rotatably supported at a first support 57 proximal the head 52 and at a second support 58 proximal the end 60. The pawl 55 includes an aperture 63 into which the threaded portion 53 of the shaft 51 is threadably received.

Figure 3:
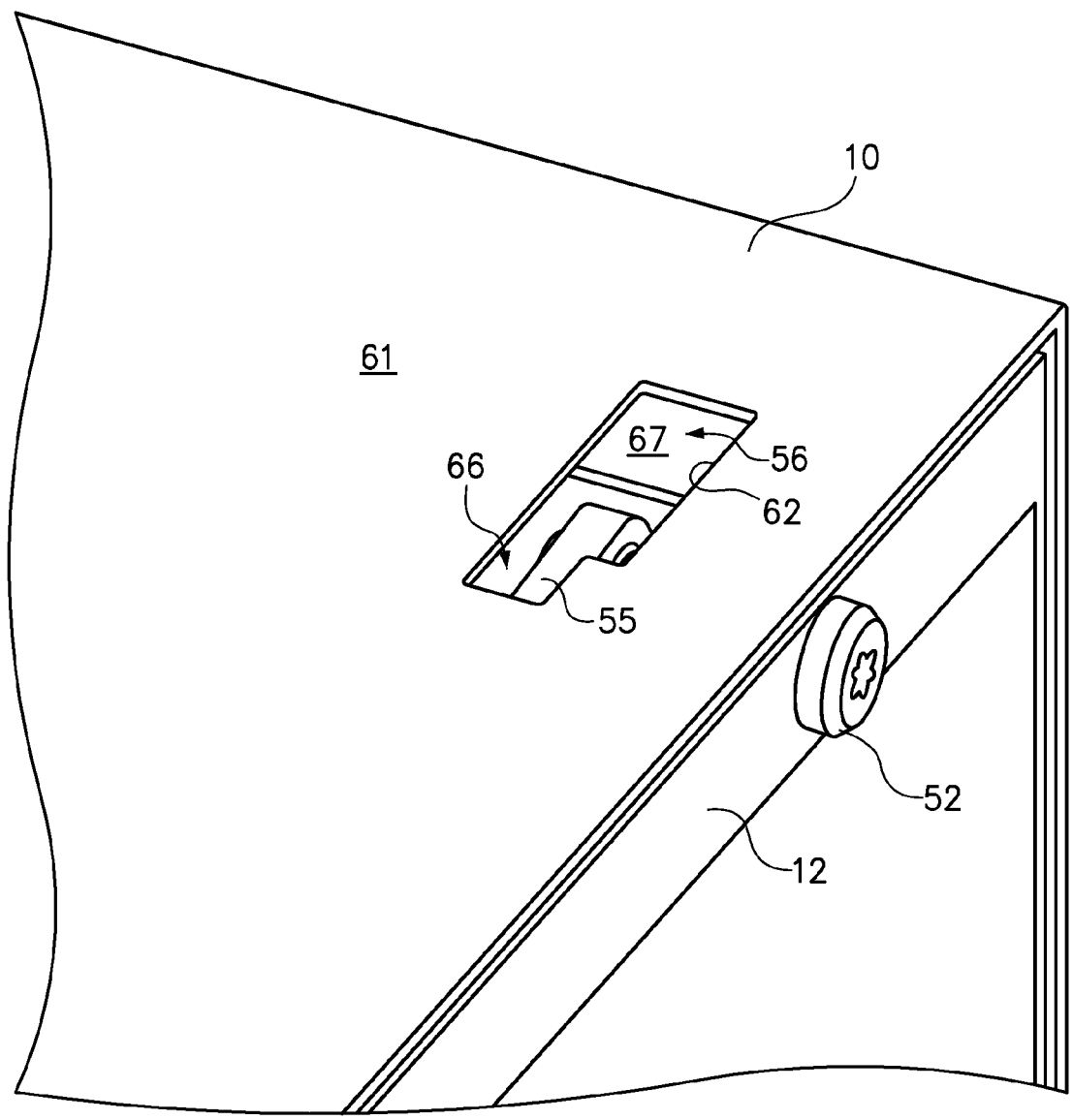
FIG. 3 is a perspective view of the wall of the chassis and the sub-chassis received into the first bay of the chassis.

FIG. 3 is a perspective view of the wall 61 of the chassis 10 and the sub-chassis 12 received into the chassis 10. The pawl 55 is in the passive position illustrated in FIG. 2 and is partially visible through the slot 56 in the wall 61 of the chassis 10. The head 52 of the shaft 51 (not shown in FIG. 3) may protrude from the sub-chassis 12 and is accessible for adjustment of the variable latch 50 (not fully shown in FIG. 3).

Figure 4:
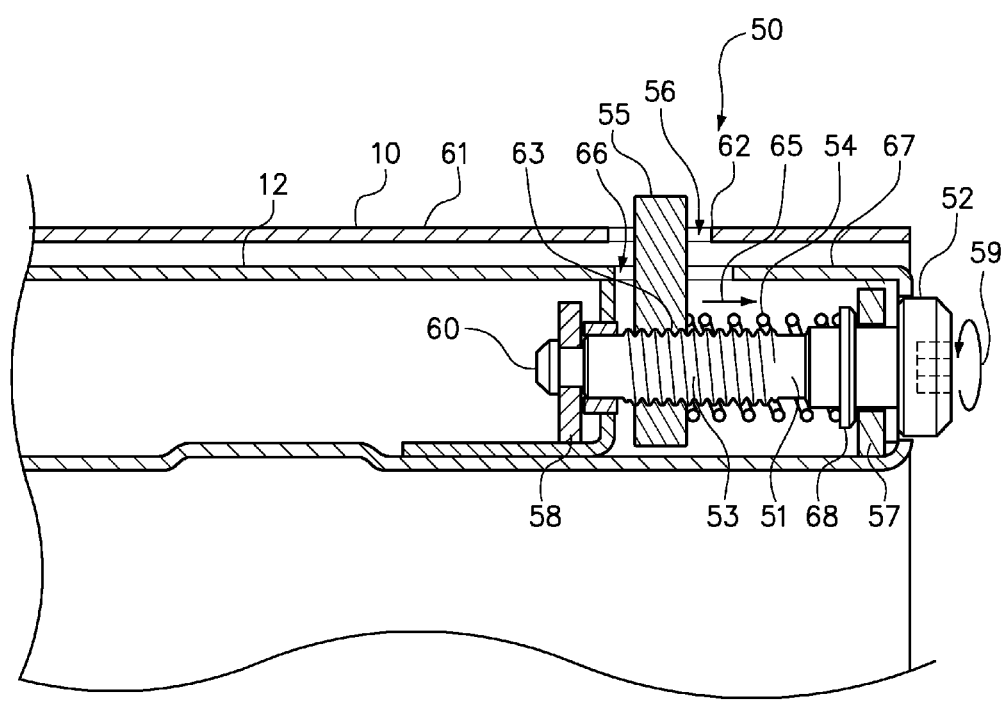
FIG. 4 is the enlarged sectional view of the variable latch of the sub-chassis of FIG. 2 with the pawl pivoted to an active position within the slot in the wall of the sub-chassis and also within the aligned slot in the wall of the chassis.

FIG. 4 is an enlarged sectional view of the variable latch 50 of the sub-chassis 12 of FIG. 2 after the pawl 55 is pivoted to an active position within the slot 66 in the wall 67 of the sub-chassis 12 and also within the aligned slot 56 in the wall 61 of the chassis 10. The pawl pivots to the active position due to rotation of the shaft and friction between the threaded pawl and the threaded shaft. In the active position illustrated in FIG. 4, the pawl 55 is disposed immediately adjacent to a load surface 62 on the chassis 10. Subsequent rotation of the head 52 of the shaft 51 in the direction indicated by arrow 59 in FIG. 4 will threadably move the pawl 55 in the direction of arrow 65. As the pawl 55 moves in the direction of the arrow 65, the spring 54 will compress between the pawl 55 and the spring stop 68 spaced apart therefrom.

Figure 5:
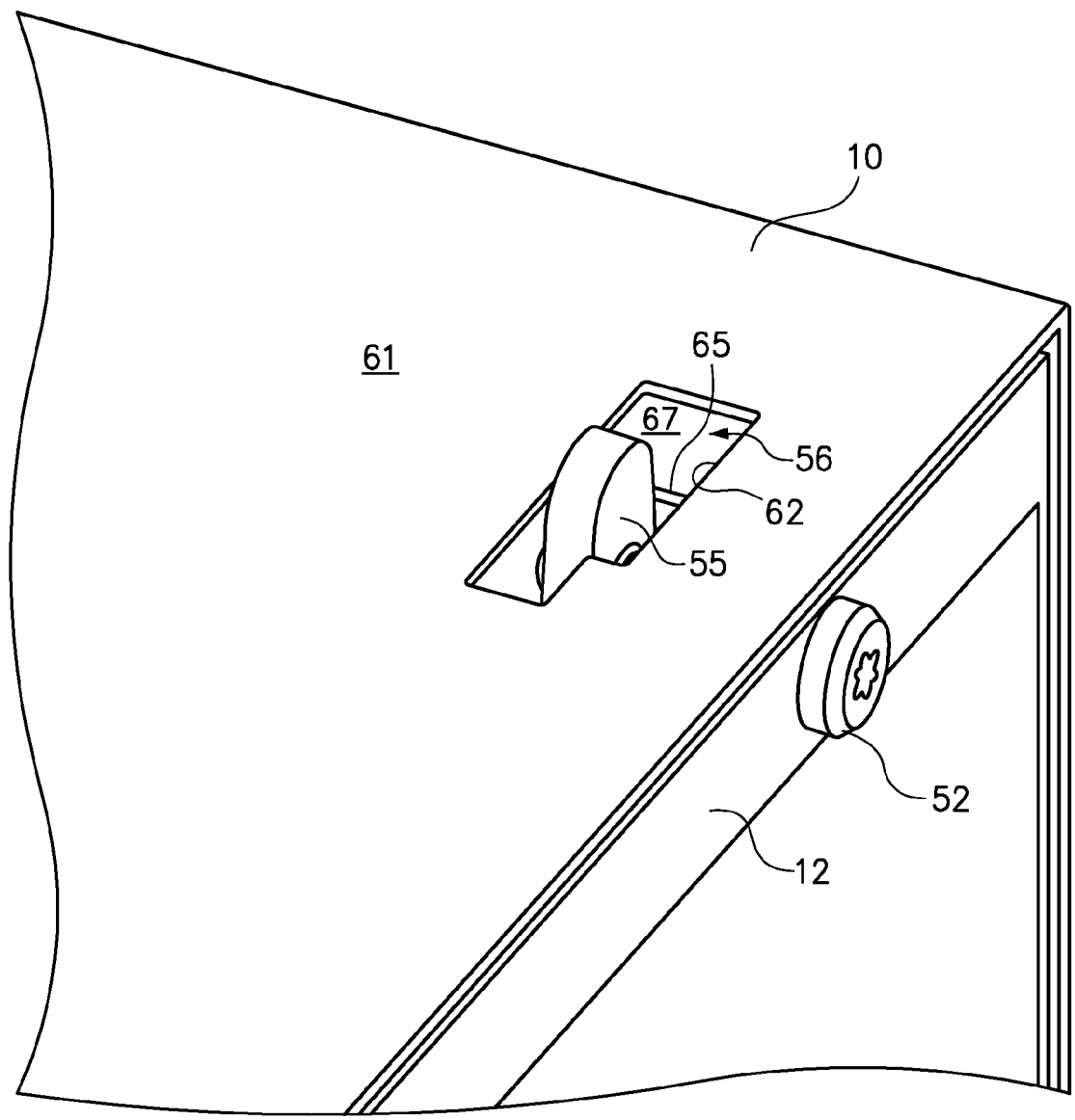
FIG. 5 is the perspective view of FIG. 3 after the pawl is pivoted about the threaded portion of the shaft (not shown in FIG. 5—see FIG. 4) to the active position.

FIG. 5 is the perspective view of FIG. 3 after the pawl 55 is pivoted about the threaded portion 53 of the shaft 51 (not shown in FIG. 5—see FIG. 4) to the active position as illustrated in FIG. 4. In the active position, the pawl 55 extends within the slot 56 of the wall 61 of the chassis 10 and is disposed immediately adjacent to the load surface 62 on the chassis 10. Over-rotation of the pawl, which would take the pawl out of the active position, is prevented by the pawl coming into contact with a lateral portion 65 of the slot 66 in the wall 67 of the sub-chassis 12. Alternatively, the pawl may come into contact with a lateral portion of the slot 56 in the wall 61 of the chassis 10.

Figure 6:
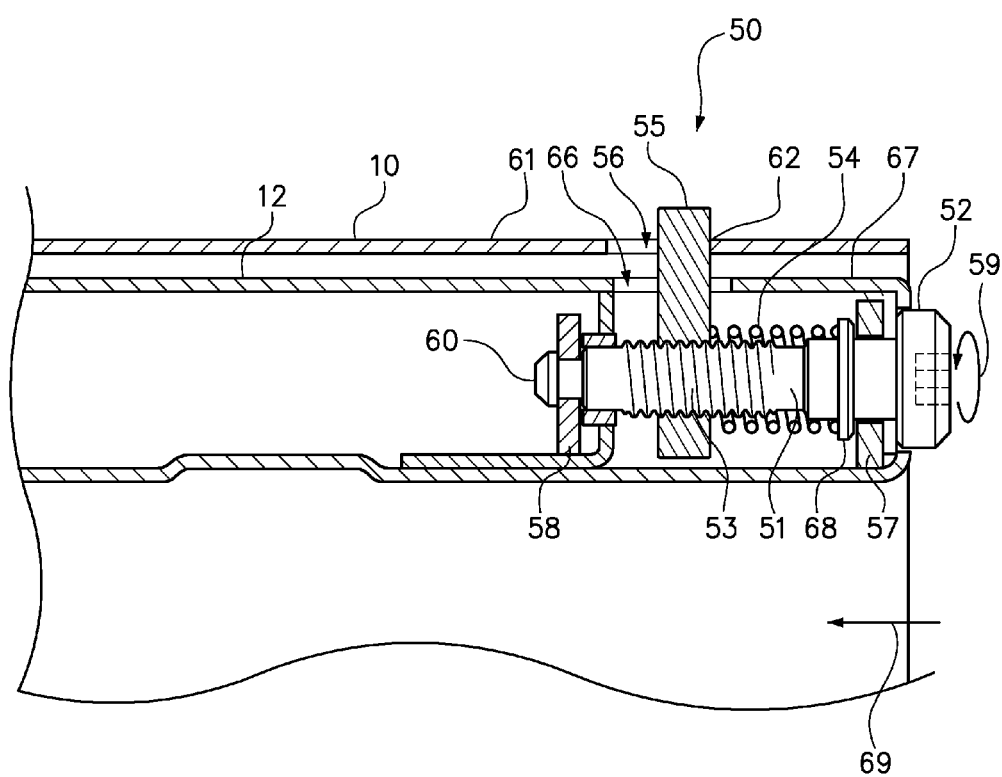
FIG. 6 is the section view of FIG. 4 after the head of the shaft is rotated in the direction of the arrow to threadably move the pawl to the load surface on the wall of the chassis.

FIG. 6 is the section view of FIG. 4 after the head 52 of the shaft 51 is rotated in the direction of the arrow 59 to threadably move the pawl 55 to and against the load surface 62 on the wall 61 of the chassis 10 adjacent to the slot 56. From this position, continued rotation of the head 52 of the shaft 51 in the direction of the arrow 59 (clockwise as viewed from the right side of the view in FIG. 6) causes the pawl 55 to bear against the load surface 62 to produce a reactive force 69 urging the sub-chassis 12 towards the left in FIG. 6. It will be understood that the reactive force produced by rotation of the head 52 of the shaft 51 of the variable latch 50 moves the proximal end of the sub-chassis against the second surface 24 of the midplane 16 (See FIG. 1).

Figure 7:
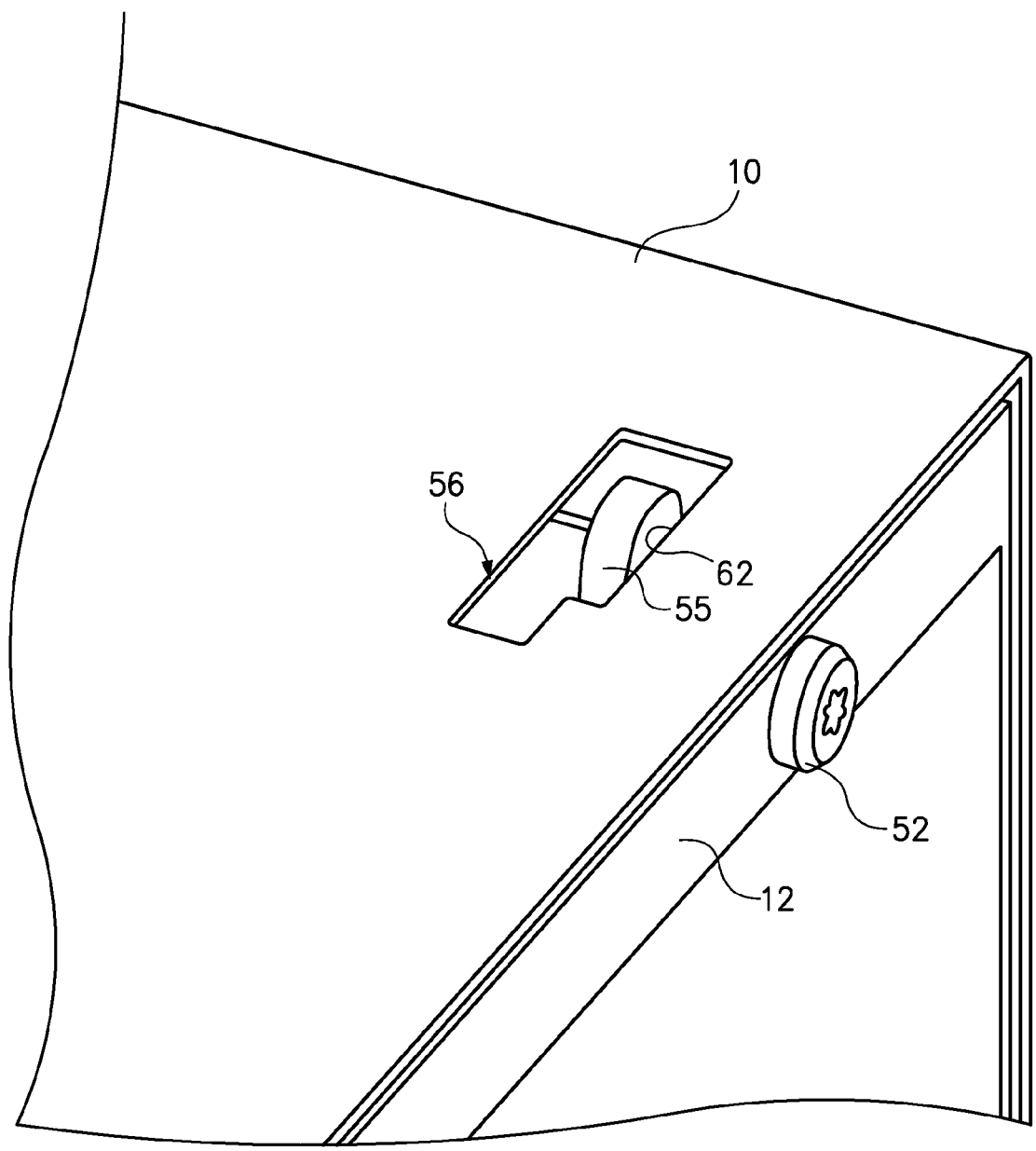
FIG. 7 is the perspective view of FIG. 5 after repositioning of the pawl to and against the load surface of the chassis.

FIG. 7 is the perspective view of FIG. 5 after the pawl 55 is repositioned to and against the load surface 62 of the chassis 10 by rotation of the head 52 of the shaft 51 (not shown in FIG. 7—see FIG. 6). After the pawl 55 engages the load surface 62, further rotation of the head 52 will move the sub-chassis 12 further into the chassis 10 towards and against the second surface of the midplane 16.

Figure 8:
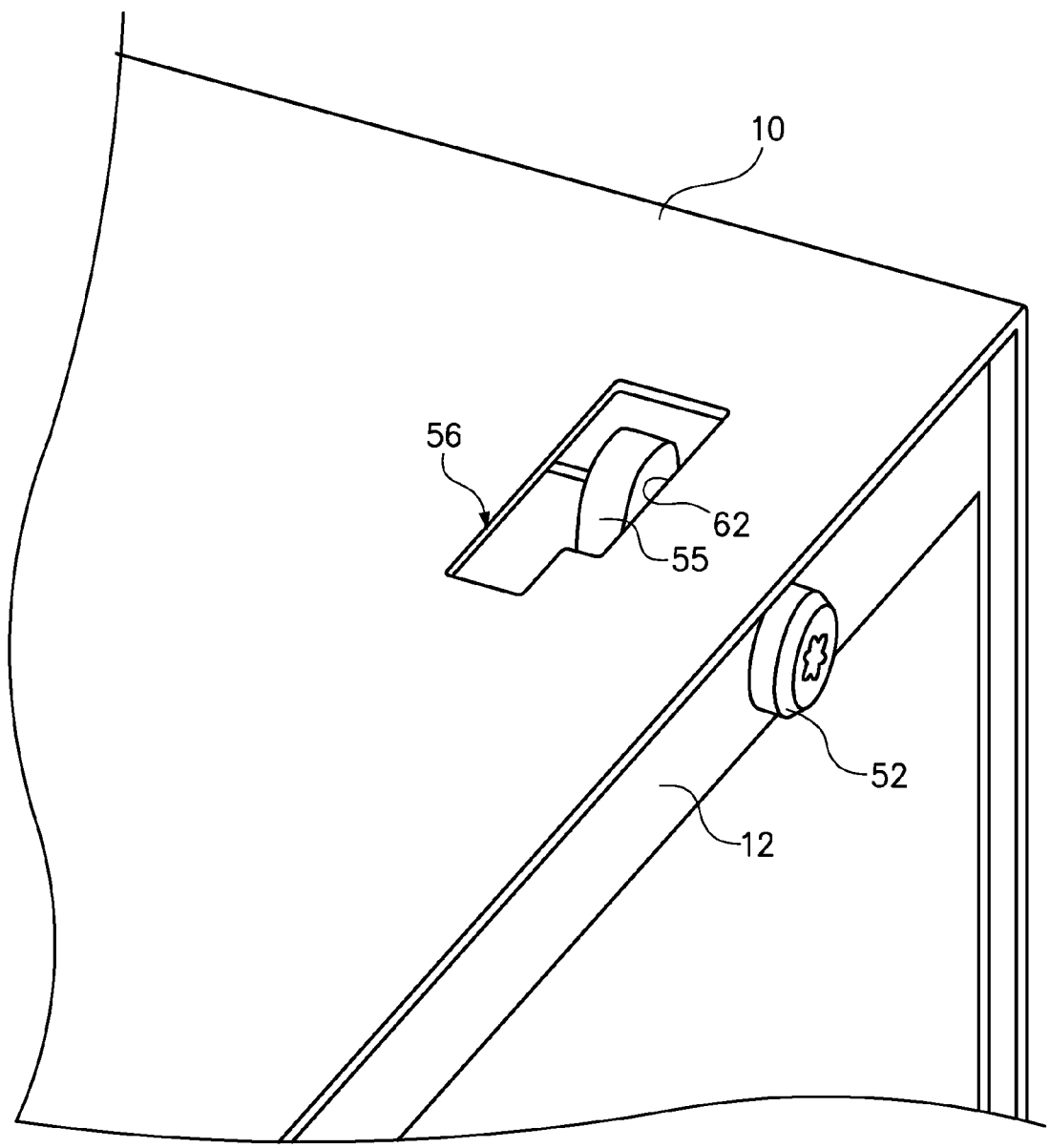
FIG. 8 is the perspective view of FIG. 6 after the sub-chassis is displaced into the chassis towards the midplane (not shown in FIG. 8—see FIG. 1) by rotation of the head of the shaft of the variable latch of FIGS. 2, 4 and 6.

FIG. 8 is the perspective view of FIG. 7 after the sub-chassis 12 is moved further into the chassis 10 so that the proximal end of the sub-chassis 12 engages the second surface 24 of the midplane 16 (not shown in FIG. 8—see FIG. 1) by rotation of the head 52 of the shaft 51 of the variable latch 50 of FIGS. 2, 4 and 6.

It will be understood that a tool, such as a ratchet, screwdriver or allen wrench can be used to rotate the head 52 of the variable latch 50. It will be further understood that the head 52 may have a grippable shape, such as a wing nut, to enable rotation using the hand.

The latch may be released to allow removal of the sub-chassis by rotating the head 52 in the reverse direction, such that the threaded shaft moves the pawl out of engagement with the load surface and then subsequently rotates the pawl from the active position to the passive position.

It should be understood that with the proximal end of the sub-chassis engaging the second surface of the midplane, electronic devices may be secured in the sub-chassis in a conventional fashion. However, any variation in the thickness of the midplane is no longer a problem since the sub-chassis now forms the frame of reference for the installation of electronic components on the second side of the midplane. This, in turn, means that the connectors of the electronic components may be made with less swipe that results in smaller stubs, which results in less electronic noise.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    securing a midplane to a bracket disposed between a first and second ends of a chassis, wherein a first surface of the midplane engages the bracket and faces the first end of the chassis;
    securing a first electronic device within the first end of the chassis with a first device connector coupled to a first midplane connector on the first surface of the midplane and a first device latch secured directly to a first slot in the chassis adjacent the first end;
    securing a sub-chassis within the second end of the chassis, wherein the sub-chassis has a proximal end that engages a second surface of the midplane; and
    securing a second electronic device within the sub-chassis with a second device connector coupled to a second midplane connector on the second surface of the midplane and a second device latch secured directly to a slot in the sub-chassis adjacent the distal end of the sub-chassis.

2. The method of claim 1, wherein securing a sub-chassis within the second end of the chassis, includes engaging a second slot in the second end of the chassis with a latch carried on a distal end of the sub-chassis.

3. The method of claim 2, further comprising:
    rotating a threaded shaft of the latch to draw a pawl in a distal direction against a load surface of the second slot.

4. The method of claim 3, wherein drawing the pawl in the distal direction against the load surface of the second slot imparts a reactive force urging the proximal end of the sub-chassis into engagement with the second surface of the midplane.

5. The method of claim 1, wherein the second electronic device is selected from a network switch, a power supply module, and a management module.

6. The method of claim 1, wherein the first electronic device is a blade server.

7. The method of claim 2, further comprising:
    rotating a threaded shaft of the latch to move a pawl from a passive position within the sub-chassis to an active position received within the second slot; and
    continuing to rotate the threaded shaft of the latch to draw the pawl, with the pawl in the active position, in a distal direction against a load surface of the second slot.

8. The method of claim 2, further comprising:
    rotating a threaded shaft of the latch to move a pawl from a passive position within the sub-chassis to an active position received within the second slot; and then
    continuing to rotate the threaded shaft of the latch to draw the pawl, with the pawl in the active position, in a distal direction relative to the threaded shaft to engage a load surface of the second slot; and then
    continuing to rotate the threaded shaft of the latch to draw the pawl, with the pawl in the active position and engaged with the load surface, in the distal direction until the proximal end of the sub-chassis is forced against the second surface of the midplane.

9. The method of claim 2, further comprising:
   guiding the sub-chassis within the second end of the chassis.

10. The method of claim 1, wherein securing a sub-chassis within the second end of the chassis, includes engaging a first slot in the second end of the chassis with a first latch carried on a distal end of the sub-chassis and engaging a second slot in the second end of the chassis with a second latch carried on the distal end of the sub-chassis, wherein the first and second latches are on generally opposite sides of the sub-chassis.

* * * * *